United States Patent
Kumakura et al.

(10) Patent No.: US 12,532,764 B2
(45) Date of Patent: Jan. 20, 2026

(54) JOINED BODY PRODUCTION METHOD, JOINED BODY, AND HOT-MELT ADHESIVE SHEET

(71) Applicant: DEXERIALS CORPORATION, Shimotsuke (JP)

(72) Inventors: Hiroyuki Kumakura, Shimotsuke (JP); Tomoyuki Abe, Shimotsuke (JP)

(73) Assignee: Dexerials Corporation, Shimotsuke (JP)

( * ) Notice: Subject to any disclaimer, the term of this patent is extended or adjusted under 35 U.S.C. 154(b) by 406 days.

(21) Appl. No.: 18/008,184

(22) PCT Filed: Jun. 3, 2021

(86) PCT No.: PCT/JP2021/021182
§ 371 (c)(1),
(2) Date: Dec. 5, 2022

(87) PCT Pub. No.: WO2021/246483
PCT Pub. Date: Dec. 9, 2021

(65) Prior Publication Data
US 2023/0307252 A1    Sep. 28, 2023

(30) Foreign Application Priority Data

Jun. 5, 2020  (JP) ................. 2020-098844
Jun. 2, 2021  (JP) ................. 2021-093292

(51) Int. Cl.
*H01L 21/603*  (2006.01)
*H01L 21/48*   (2006.01)
*H01L 21/60*   (2006.01)

(52) U.S. Cl.
CPC ........ *H01L 21/603* (2021.08); *H01L 21/4875* (2013.01); *H01L 2021/6015* (2013.01)

(58) Field of Classification Search
CPC ........... H01L 21/603; H01L 2021/6015; H01L 21/4875; B29C 65/4815; H01R 4/04;
(Continued)

(56) References Cited

U.S. PATENT DOCUMENTS 6,712,262 B2 *  3/2004  Akaike ................. C23F 11/08
                                              148/26
2003/0141351 A1   7/2003  Akaike et al.
(Continued)

FOREIGN PATENT DOCUMENTS

JP   2003031929 A   1/2003
JP   2013140756 A   7/2013
(Continued)

OTHER PUBLICATIONS

English Translation of JP2014017248 (Year: 2014).*
(Continued)

*Primary Examiner* — Michael A Tolin
*Assistant Examiner* — Hana C Page
(74) *Attorney, Agent, or Firm* — Element IP, PLC (57) ABSTRACT

A joined body production method includes subjecting a first electronic component and a second electronic component to thermocompression bonding via a hot-melt adhesive sheet. The hot-melt adhesive sheet includes a binder and solder particles. The binder includes a crystalline polyamide resin having a carboxyl group. A melting point of the solder particles is 30° C. to 0° C. lower than a temperature of the thermocompression bonding. When melt viscosities of the hot-melt adhesive sheet are measured under a condition of a heating rate of 5° C./min., the hot-melt adhesive sheet has a ratio of a melt viscosity at 40° C. lower than the temperature of the thermocompression bonding to a melt viscosity at 20° C. lower than the temperature of the thermocompression bonding of no less than 10.

12 Claims, 2 Drawing Sheets

(58) Field of Classification Search
CPC .. C09J 5/06; C09J 2203/326; C09J 2301/314; C09J 2301/408
See application file for complete search history.

(56) References Cited

U.S. PATENT DOCUMENTS

| | | | |
|---|---|---|---|
| 2005/0282002 A1* | 12/2005 | Husemann | C09J 5/06 428/328 |
| 2015/0237725 A1 | 8/2015 | Yamada et al. | |

FOREIGN PATENT DOCUMENTS

| | | | |
|---|---|---|---|
| JP | 2014017248 | A | 1/2014 |
| JP | 2014026963 | A | 2/2014 |
| JP | 5964187 | B2 | 8/2016 |
| JP | 2017117468 | A | 6/2017 |

OTHER PUBLICATIONS

Machine Translation of Ishiguro (JP2017218494) (Year: 2017).*
Machine Translation of Masui (JP2014017248A) (Year: 2014).*
Machine Translation of Ishizawa (JP2014026963A) (Year: 2014).*
Machine Translation of Ishimatsu (WO2020090684) (Year: 2020).*
Machine Translation of Izawa (WO 2009038190) (Year: 2009).*
Written Opinion issued Aug. 10, 2021 in PCT/JP2021/021182 (with English translation), 12 pages.
International Search Report issued Aug. 10, 2021 in PCT/JP2021/021182 (with English translation), 7 pages.
Office Action issued Jun. 24, 2025, in corresponding Japanese Patent Application No. 2021-093292 (with machine English translation), 18 pages.
Office Action issued Sep. 24, 2025, in corresponding Japanese Patent Application No. 2021-093292 (with machine English translation), 4 pages.

* cited by examiner

JOINED BODY PRODUCTION METHOD, JOINED BODY, AND HOT-MELT ADHESIVE SHEET

TECHNICAL FIELD

The present art relates to a method of producing a joined body using a hot-melt adhesive sheet containing electroconductive particles and to a joined body. Priority of the present application is claimed based on Japanese Patent Application No. 2020-098844, filed in Japan on Jun. 5, 2020, and Japanese Patent Application No. 2021-093292, filed in Japan on Jun. 2, 2021. The contents of these applications are incorporated in the present application by reference.

BACKGROUND TECHNOLOGY

Conventionally, as a means of connecting electronic components to each other, a connecting material such as an anisotropic conductive film (ACF) or an anisotropic conductive paste (ACP) is used. An ACF is, for example, a connecting material in the form of a film made by dispersing electroconductive particles in an insulating binder including a thermosetting resin. An ACP is, for example, a connecting material in the form of a paste made by dispersing electroconductive particles in an insulating binder including a thermosetting resin. The connection is performed by subjecting electrode portions of the electronic components to be subjected to an anisotropic conductive connection to each other to thermocompression bonding via an ACF or an ACP, thereby performing thermosetting of the binder including the thermosetting resin. The ACF and ACP are one example of an adhesive film or adhesive containing electroconductive particles.

In recent years, in connecting electronic components to each other, connection at a low temperature, a low pressure, and in a short time is in demand. Connection at a low temperature is in demand from a viewpoint of reducing thermal damage to the electronic components, a viewpoint of preventing heating-temperature variation when performing the connection, a viewpoint of reducing a load on mounting facilities, and the like. Connection at a low pressure is in demand from a viewpoint of damage arising due to board characteristics (board thinness, configuration, materials) and the like. Connection in a short time is in demand from a viewpoint of productivity and the like.

However, because a conventional ACF uses a thermosetting resin, attempting to accommodate connection at a low temperature and in a short time causes setting during storage. As such, a storage period needs to be shortened, which may be impractical. Moreover, from the viewpoint of productivity, a storage stability of about one to two years at room temperature may be in demand, but this may be difficult to accommodate using an ACF using a thermosetting resin.

Therefore, as an ACF that enables connection at a low temperature, at a low pressure, and in a short time while maintaining sufficient connection resistance, a thermoplastic ACF made of a crystalline resin and an amorphous resin is proposed (for example, see Patent Document 1). Such an ACF or ACP is used for an anisotropic conductive connection between a first electronic component and a second electronic component respectively provided with a plurality of opposing terminals and is also used for an anisotropic conductive connection in a situation where at least one among the first electronic component and the second electronic component is provided with a full-face electrode. Needless to say, these can also be used for an electrical connection where each terminal is a full-face electrode.

However, even such an ACF may be unable to provide excellent adhesion strength and connection reliability when an electrode surface of an electronic component is subjected to an OSP treatment (water-soluble pre-flux treatment).

CITATION LIST

Patent Documents

Patent Document 1: Japanese Patent Number 5964187
Patent Document 2: Japanese Unexamined Patent Application Publication No. 2017-117468

SUMMARY OF INVENTION

Problem to be Solved by Invention

The present art is proposed in view of such conventional circumstances and provides a joined body production method, a joined body, and a hot-melt adhesive sheet containing electroconductive particles whereby excellent adhesion strength and connection reliability can be obtained.

Means to Solve the Problem

A joined body production method of the present art is a joined body production method including subjecting a first electronic component and a second electronic component to thermocompression bonding via a hot-melt adhesive sheet containing electroconductive particles, which contains solder particles in a binder including a crystalline polyamide resin having a carboxyl group, and connecting a conductive portion of the first electronic component and a conductive portion of the second electronic component. A melting point of the solder particles is 30 to 0° C. lower than a temperature of the thermocompression bonding. When melt viscosities of the hot-melt adhesive sheet containing electroconductive particles are measured under conditions of a heating rate of 5° C./min., a ratio of a melt viscosity at 40° C. lower than the temperature of thermocompression bonding to a melt viscosity at 20° C. lower than the temperature of thermocompression bonding is no less than 10.

A joined body of the present art is provided with a first electronic component, a second electronic component, and an adhesive layer connecting a conductive portion of the first electronic component and a conductive portion of the second electronic component. The adhesive layer contains solder particles of a melting point of 130 to 160° C. in a binder including a crystalline polyamide resin having a carboxyl group. When melt viscosities of the adhesive layer are measured under conditions of a heating rate of 5° C./min., a ratio of a melt viscosity at 1(00° C. to a melt viscosity at 120° C. is no less than 10.

A hot-melt adhesive sheet containing electroconductive particles of the present art contains solder particles of a melting point of 130 to 160° C. in a binder including a crystalline polyamide resin having a carboxyl group. When melt viscosities of the sheet are measured under conditions of a heating rate of 5° C./min., a ratio of a melt viscosity at 100° C. to a melt viscosity at 120° C. is no less than 10.

Effect of the Invention

According to the present art, the crystalline polyamide having a carboxyl group can improve solder wettability and provide excellent adhesion strength and connection reliability.

DESCRIPTION OF THE EMBODIMENTS

An embodiment of the present art is described in detail below with reference to the drawings and in the following order.
1. Joined body
2. Joined body production method
3. Hot-melt adhesive sheet containing electroconductive particles
4. Examples

1. Joined Body

A joined body of the present embodiment is provided with a first electronic component, a second electronic component, and an adhesive layer connecting a conductive portion of the first electronic component and a conductive portion of the second electronic component. The adhesive layer contains solder particles of a melting point of 130 to 160° C. in a binder including a crystalline polyamide resin having a carboxyl group. When melt viscosities of the adhesive layer are measured under conditions of a heating rate of 5° C./min., a ratio of a melt viscosity at 100° C. to a melt viscosity at 120° C. is no less than 10. This can improve solder wettability and provide excellent adhesion strength and connection reliability.

A viscosity of the adhesive layer at 100° C. is preferably 8,000 to 800.000 Pa·s, more preferably 15,000 to 500.000 Pa·s, and further preferably 20,000 to 300,000 Pa·s. Moreover, a viscosity of the adhesive layer at 120° C. is preferably 100 to 20,000 Pa·s, more preferably 500 to 15.000 Pa·s, and further preferably 1,000 to 8,000 Pa·s. Here, melt viscosities of the adhesive layer can be measured by, for example, using a rotary rheometer (made by HAAKE) under conditions of a gap of 0.2 mm, a temperature range of 60 to 200° C., a heating rate of 5° C./min., a measurement frequency of 1 Hz. and a measurement plate diameter of 8 mm. Note that melt-viscosity temperatures can be set according to base material characteristics, connection mass-producibility, and other conditions and can thus be changed according to the objects to be connected and their connection conditions.

Figure 1:
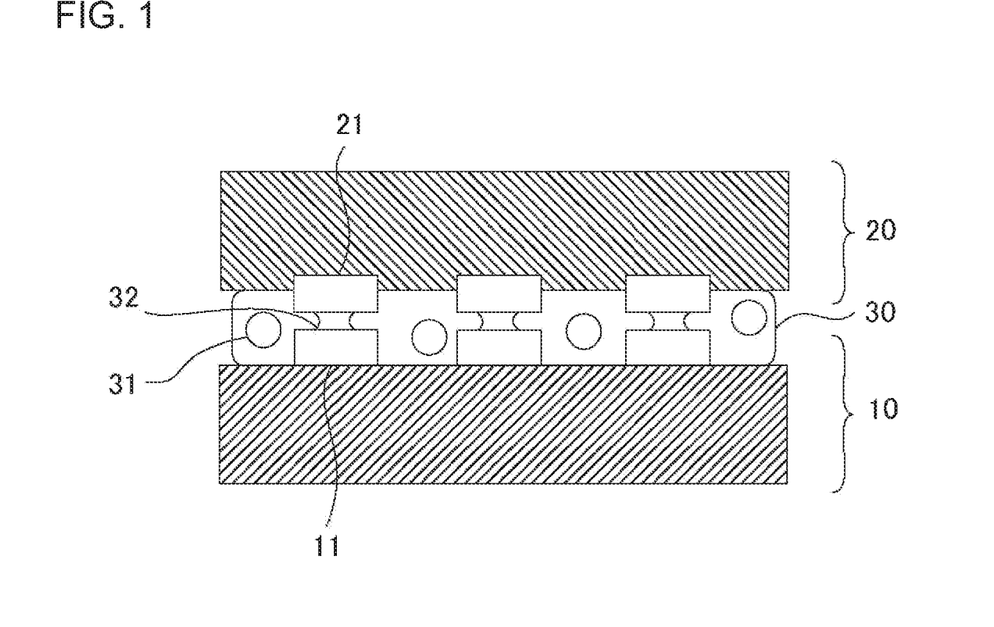
FIG. 1 is a cross-sectional view schematically illustrating one example of a joined body of the present embodiment.

FIG. 1 is a cross-sectional view schematically illustrating one example of the joined body of the present embodiment. As illustrated in FIG. 1, the joined body is provided with a first electronic component 10 having a first conductive portion 11, a second electronic component 20 having a second conductive portion 21, and an adhesive layer 30 made of a hot-melt adhesive sheet containing electroconductive particles connecting the conductive portion 11 of the first electronic component 10 and the conductive portion 21 of the second electronic component 21. Here, the first conductive portion 11 and the second conductive portion 21 are not limited in particular; these may be an electrode, a wire, a terminal row, or the like and can be selected from among various forms.

As the first electronic component 10, it can be broadly defined as a card member of a smart card (smart card) or a substrate (so-called printed wiring board: PWB) on which the second electronic component can be mounted. For example, a rigid board, a glass board, a flexible board (FPC: flexible printed circuit), a ceramic board, a plastic board, or the like can be exemplified.

Furthermore, as the second electronic component 20, an IC chip of a smart card, an LED (light-emitting diode), a driver IC (integrated circuit), or other chip (element); a flexible board (FPC: flexible printed circuit); a resin-molded component; and other components provided with wiring (conductive member) can be exemplified.

As described below, the adhesive layer 30 is a hot-melt adhesive sheet containing electroconductive particles that contains solder particles in a binder and is made into a film. The adhesive layer 30 forms a solder joint 32 between the first conductive portion 11 of the first electronic component 10 and the second conductive portion 21 of the second electronic component 20 and uses the binder to adhere the first electronic component 10 and the second electronic component to each other. When the first conductive portion 11 and the second conductive portion 21 oppose each other and are each constituted by a group of individual and independent electrodes, an anisotropic conductive connection is formed, enabling the hot-melt adhesive sheet containing electroconductive particles of the present art to be used. Moreover, the hot-melt adhesive sheet containing electroconductive particles of the present art can also be used for (isotropic) conductive connection in a situation wherein the first conductive portion 11 and the second conductive portion 21 are each constituted by a full-face electrode. Moreover, the hot-melt adhesive sheet containing electroconductive particles of the present art can also be used in a situation where one conductive portion is made of a group of individual and independent electrodes and the other conductive portion is a full-face electrode. The same can also be said for known anisotropic conductive films. Needless to say, "anisotropic" conduction presents greater technical difficulties.

The joined body of the present embodiment is provided with an adhesive layer that contains solder particles having a predetermined melting point in a binder that includes a crystalline polyamide having a carboxyl group, the binder having melt viscosities of a predetermined relationship. As such, solder wettability can be improved, and excellent adhesion strength and connection reliability can be obtained even when an electrode surface of an electronic component is subjected to an OSP treatment (water-soluble pre-flux treatment). This is believed to be a flux effect due to the carboxyl group present in the crystalline polyamide. Moreover, in the joined body of the present embodiment, a conductive portion of a first electronic component and a conductive portion of a second electronic component are metal-bonded by melted solder particles. As such, swelling and stretching due to moisture absorption by the binder in a wet heat test can be suppressed, and excellent connection reliability can be obtained.

Next, as a specific example of the joined body, a smart card that uses a card member as the first electronic component 10 and uses an IC chip as the second electronic component is described. A smart card is a card incorporating an integrated circuit (IC: integrated circuit) for recording and computing information (data) and is also referred to as an "IC card (integrated circuit card)" or a "chip card". Moreover, a smart card may be a dual interface card having two interfaces—a contact interface and a noncontact interface—in one IC chip or a hybrid card on which a contact IC chip and a noncontact IC chip are mounted. The IC chip used in this smart card differs from IC chips for general display applications and the like and generally does not have a plurality of terminal rows. The IC chip described below is described as an IC chip used in a smart card.

Figure 2:
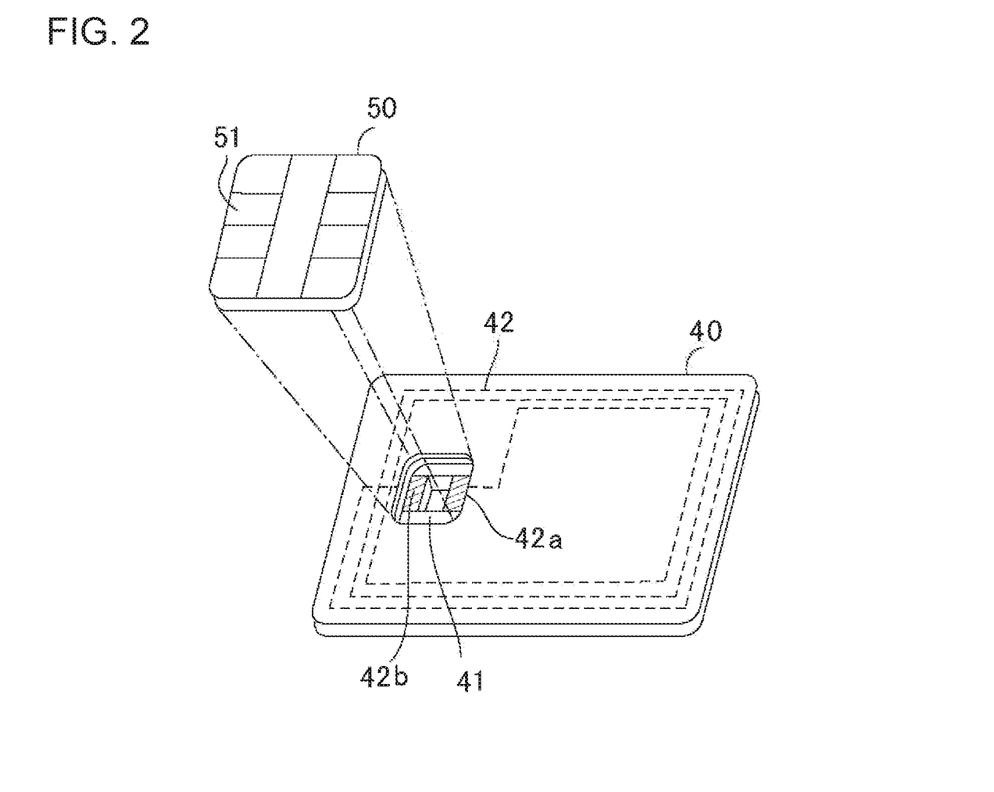
FIG. 2 is a schematic perspective view illustrating one example of a smart card.
Figure 3:
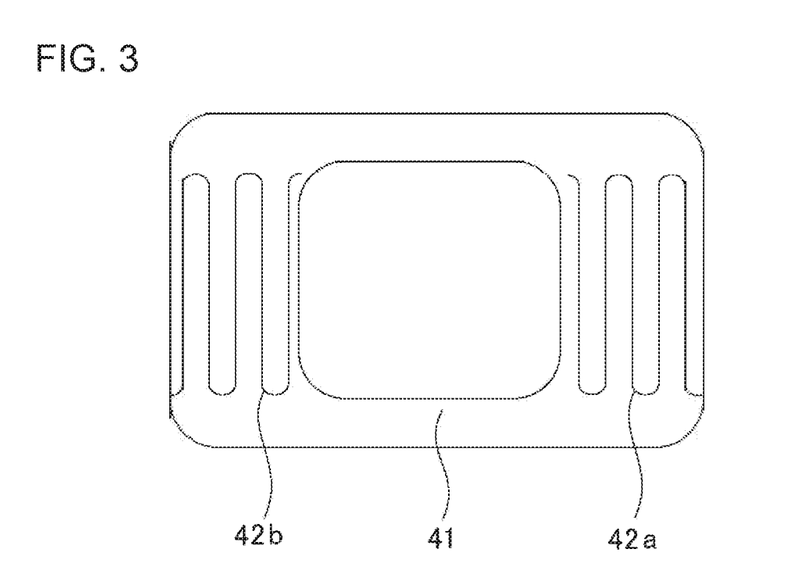
FIG. 3 is a top view illustrating one example of an IC chip area of a card member.

FIG. 2 is a schematic perspective view illustrating one example of the smart card, and FIG. 3 is a top view illustrating one example of an IC chip area of the card member. The smart card is provided with a card member 40 and an IC chip 50. The card member 40 is a laminated body in which a first substrate, a second substrate provided with an antenna, and a third substrate are laminated in this order. The IC chip 50 has a plurality of contact terminals 51 on its surface and has, for example, a full-face electrode on its reverse face.

The first substrate, the second substrate, and the third substrate are configured by, for example, laminating a plurality of layers made of a resin. As the resin configuring each layer, for example, PVC (polyvinyl chloride) including recycled products, PET (polyethylene terephthalate), PET-G, PC (polycarbonate), an environmentally friendly biodegradable plastic (PLA (polylactic acid) being one example), and a substrate made of plastic waste collected before flowing into the ocean referred to as ocean plastic can be mentioned. Configuring the substrate from a plurality of layers can prevent rigidity from becoming unnecessarily high compared to a situation of configuring the substrate from one layer.

The first substrate has an opening 41 corresponding to a shape of the IC chip 50. The opening 41 exposes the second substrate and forms the IC chip area. The second substrate is placed between the first substrate and the third substrate and has an antenna pattern 42 that circles an outer peripheral portion a plurality of times inside a layer made of, for example, a resin. Moreover, the second substrate forms, in the IC chip area facing the opening 41, a concave portion by being recessed in correspondence with the back face of the IC chip 50, so that, for example, a portion of the embedded antenna pattern is exposed. That is, the concave portion of the second substrate corresponds to a shape of the opening 41, and a first exposed portion 42a and a second exposed portion 42b of the antenna pattern 42 are formed in the IC chip area. As a metal wire of the antenna pattern 42, for example, a copper wire can be mentioned.

Furthermore, the second substrate preferably has a groove or a plurality of holes, each of which is a non-through hole in the IC chip area. This enables the resin of the adhesive layer to flow into the groove or the holes to improve an adhering force with the adhesive layer. Moreover, a minimum length of an opening portion of the groove or the holes is preferably less than an average particle size of the solder particles. A specific lower limit of the minimum length of the opening portion of the groove or the holes is preferably no less than 20% of the average particle size of the solder particles, more preferably no less than 30%, and particularly preferably no less than 40%. Moreover, a specific upper limit of the minimum length of the opening portion of the holes is preferably no greater than 80% of the average particle size of the solder particles, more preferably no greater than 70%, and particularly preferably no greater than 60%. This makes it easier for the solder particles to fit in the groove or the holes, improves trapping of the solder particles, and can provide an excellent electrical connection with the IC chip.

The adhesive layer is interposed between the IC chip area of the opening 41 and the IC chip 50 and electrically connects the IC chip 50 and the first exposed portion 42a and second exposed portion 42b of the antenna pattern 42. Note that there are situations where the connection between the IC chip 50 and the antenna pattern 42 is not anisotropic.

The smart card illustrated as a specific example is provided with an adhesive layer that contains solder particles having a predetermined melting point in a binder that includes a crystalline polyamide having a carboxyl group, the binder having melt viscosities of a predetermined relationship. As such, solder wettability can be improved, and excellent adhesion strength and connection reliability can be obtained. This is believed to be a flux effect due to the carboxyl group present in the crystalline polyamide. Moreover, in the smart card illustrated as a specific example, a conductive portion of an IC chip and a conductive portion of an antenna pattern are metal-bonded by melted solder particles. As such, swelling and stretching due to moisture absorption by the binder in a wet heat test can be suppressed, and excellent connection reliability can be obtained. Note that the present art can be applied in general anisotropic connection bodies other than smart cards such as an FOB made of a rigid board and a FPC. However, details are omitted. Moreover, for application as the present art, a joined body production method has substantially the same scope.

2. Joined Body Production Method

A joined body production method of the present embodiment is a joined body production method including subjecting a first electronic component and a second electronic component to thermocompression bonding via a hot-melt adhesive sheet containing electroconductive particles, which contains solder particles in a binder including a crystalline polyamide resin having a carboxyl group, and connecting a conductive portion of the first electronic component and a conductive portion of the second electronic component. A melting point of the solder particles is 30 to 0° C. lower than a temperature of the thermocompression bonding. When melt viscosities of the hot-melt adhesive sheet containing electroconductive particles are measured under conditions of a heating rate of 5° C./min., a ratio of a melt viscosity at 40° C. lower than the temperature of thermocompression bonding to a melt viscosity at 20° C. lower than the temperature of thermocompression bonding is no less than 10. This can improve solder wettability and provide excellent adhesion strength and connection reliability. The conditions of the temperatures exhibiting these viscosities can be changed according to the joined body production method.

An affixing step (A) of affixing the hot-melt adhesive sheet containing electroconductive particles to the second electronic component, a placing step (B) of placing the second electronic component to the first electronic component, and a compression bonding step (C) of subjecting the first electronic component and the second electronic component to thermocompression bonding are described below with reference to FIG. 1.

[Affixing Step (A)]

At the affixing step (A), the hot-melt adhesive sheet containing electroconductive particles is affixed to a connection face of the second electronic component 20. The affixing step (A) may be a laminating step of laminating the hot-melt adhesive sheet containing electroconductive particles to the connection face of the second electronic component or a temporary affixing step of pasting the hot-melt adhesive sheet containing electroconductive particles at a low temperature to the connection face of the second electronic component 20.

When the affixing step (A) is a laminating step, a pressurizing laminator may be used, or a vacuum pressurizing laminator may be used. The affixing step (A) being a laminating step enables mounting of a comparatively wide area at once compared to a temporary affixing step. Moreover, the affixing step (A) being a temporary affixing step provides economic merits because minimal changes such as tool dispositions and changes from a conventional apparatus are sufficient.

At the affixing step (A), a temperature that the hot-melt adhesive sheet containing electroconductive particles reaches is preferably no lower than a temperature at which the binder flows and lower than a temperature at which the solder melts. Here, the temperature at which the binder flows may be a temperature whereat a melt viscosity of the hot-melt adhesive sheet containing electroconductive particles is 100 to 1,000,000 Pa·s and is preferably a temperature whereat this is 1,000 to 100,000 Pa·s. This enables the hot-melt adhesive sheet containing electroconductive particles to be affixed to the connection face of the second electronic component 20 in a state where a shape of the solder particles is maintained.

Note that melt viscosities of the hot-melt adhesive sheet containing electroconductive particles can be measured by, for example, using a rotary rheometer (made by HAAKE) under conditions of a gap of 0.2 mm, a temperature range of 60 to 200° C., a heating rate of 5° C./min., a measurement frequency of 1 Hz, and a measurement plate diameter of 8 mm.

[Placing Step (B)]

At the placing step (B), the second electronic component 20 is picked up using, for example, a tool provided with an adsorption mechanism. The first electronic component 10 and the second electronic component 20 are aligned, and the second electronic component 20 is placed via the hot-melt adhesive sheet containing electroconductive particles.

[Compression Bonding Step (C)]

At the compression bonding step (C), a compression bonding apparatus is used to subject the first electronic component 10 and the second electronic component 20 to thermocompression bonding. At the compression bonding step (C), the binder of the hot-melt adhesive sheet containing electroconductive particles is sufficiently removed, and the solder joint 32 is formed between the conductive portion 11 of the first electronic component 10 and the conductive portion 21 of the second electronic component 20 by melting solder particles 31.

A thermocompression bonding temperature at the compression bonding step (C) is preferably set so that the temperature reaching the hot-melt adhesive sheet containing electroconductive particles is no lower than the melting point of the solder particles. An upper limit of the temperature reaching the hot-melt adhesive sheet containing electroconductive particles is preferably 0 to 30° C. higher than the melting point of the solder particles, more preferably 0 to 20° C. higher than the melting point of the solder particles, and more preferably 0 to 10° C. higher than the melting point of the solder particles. A specific temperature reaching the hot-melt adhesive sheet containing electroconductive particles is preferably 120 to 180° C., more preferably 120 to 170° C. and further preferably 130 to 160° C. This can suppress thermal shock to the first electronic component 10 and the second electronic component 20 and prevent deformation of the joined body. Moreover, at the compression bonding step (C), the binder of the hot-melt adhesive sheet containing electroconductive particles is sufficiently removed, and metal-bonding is performed by melting the solder particles. As such, thermocompression bonding may be performed a plurality of times.

The joined body production method of the present embodiment uses a hot-melt adhesive sheet containing electroconductive particles that contains solder particles having a predetermined melting point in a binder that includes a crystalline polyamide having a carboxyl group, the binder having melt viscosities of a predetermined relationship. As such, solder wettability can be improved and excellent adhesion strength and connection reliability can be obtained even when an electrode surface of an electronic component is subjected to an OSP treatment (water-soluble pre-flux treatment). This is believed to be a flux effect due to the carboxyl group present in the crystalline polyamide. Moreover, in the joined body production method of the present embodiment, a conductive portion of a first electronic component and a conductive portion of a second electronic component are metal-bonded by melted solder particles. As such, swelling and stretching due to moisture absorption by the binder in a wet heat test can be suppressed, and excellent connection reliability can be obtained.

3. Hot-Melt Adhesive Sheet Containing Electroconductive Particles

The hot-melt adhesive sheet containing electroconductive particles of the present embodiment contains solder particles of a melting point of 130 to 160° C. in a binder including a crystalline polyamide resin having a carboxyl group. When melt viscosities of the sheet are measured under conditions of a heating rate of 5° C./min., a ratio of a melt viscosity at 100° C. to a melt viscosity at 120° C. is no less than 10. This can improve solder wettability and provide excellent adhesion strength and connection reliability. The conditions of the temperatures exhibiting these viscosities can be changed according to the joined body production method.

A lower limit of a thickness of the hot-melt adhesive sheet containing electroconductive particles is preferably no less than 10 μm, more preferably no less than 20 μm, and more preferably no less than 30 μm. Moreover, an upper limit of the thickness of the hot-melt adhesive sheet containing electroconductive particles is preferably no greater than 100 μm, more preferably no greater than 80 μm, and further preferably no greater than 60 μm. This enables suitable use of the sheet in producing a smart card in which an IC chip is subjected to thermocompression bonding to a card member.

[Binder]

The binder at least includes a crystalline polyamide having a carboxyl group. Note that a crystalline resin can be confirmed by, for example, observing an endothermic peak in a heating process in differential scanning calorimetry.

A terminal carboxyl group concentration of the crystalline polyamide is preferably no less than 0.5 mg KOH/g, more preferably no less than 1.0 mg KOH/g, and further preferably no less than 2.0 mg KOH/g. Moreover, the terminal carboxyl group concentration of the crystalline polyamide may be 50 mg KOH/g or less, 30 mg KOH/g or less, or 10 mg KOH/g or less. The terminal carboxyl group concentration of the crystalline polyamide can be evaluated according to, for example, JIS K0070-1992 or ISO 2114. As specific examples of a commercial product of the crystalline polyamide having a carboxyl group, for example, "HX2519" and "M1276" made by Arkema S.A. can be mentioned.

The crystalline polyamide having a carboxyl group is preferably a copolymer based on lauryl lactam (PA12: Polyamide 12 or Nylon 21) or 11-amino undecanoic acid (PA11: Polyamide 11) as a monomer. Such a copolymer has higher crystallinity, higher melt viscosities, and higher rigidity than a polyamide based on a dimer acid. As such, excellent connection reliability can be obtained.

A lower limit of a melting point of the crystalline polyamide having a carboxyl group is preferably no less than 70° C., more preferably no less than 80° C. and further preferably no less than 90° C. Moreover, an upper limit of the melting point of the crystalline polyamide having a carboxyl group is preferably no greater than 150° C., more preferably no greater than 140° C., and further preferably no greater than 130° C. When the melting point of the crystalline polyamide having a carboxyl group is too high, a viscosity of the binder is not sufficiently lowered. As such, resin removal becomes insufficient, and conduction characteristics tend to worsen. Moreover, when the melting point of the crystalline polyamide having a carboxyl group is too low, hardness at press-out tends to be insufficient. The melting point can be measured by, for example, differential scanning calorimetry (DSC).

A lower limit of a weight-average molecular weight of the crystalline polyamide having a carboxyl group is preferably no less than 5,000, more preferably no less than 8.000, further preferably no less than 10,000, and most preferably over 10.000. Moreover, an upper limit of the weight-average molecular weight of the crystalline polyamide having a carboxyl group is preferably no greater than 100.000, more preferably no greater than 50,000, and further preferably no greater than 30.000. When the weight-average molecular weight of the crystalline polyamide having a carboxyl group is too low, binder setting is insufficient. This may cause an inconvenience such as increased resistance in a connection reliability test. A weight-average molecular weight Mw can be made to be, for example, a standard polystyrene molecular weight conversion value measured by gel permeation chromatography (GPC).

Furthermore, for the crystalline polyamide having a carboxyl group, a melt volume flow rate (MVR) measured under conditions of a temperature of 160° C. and a load of 2.16 kg is preferably 2 to 50 cm$^3$/10 min., more preferably 3 to 30 cm$^3$/10 min., and further preferably 5 to 10 cm$^3$/10 min. When the melt volume flow rate is too high, hardness at press-out is insufficient, and connection reliability tends to decrease. The melt volume flow rate can be measured according to the rules for finding a melt flow rate of a thermoplastic plastic of JIS K7210:1999.

The binder at least including a crystalline polyamide having a carboxyl group can improve solder wettability and provide excellent connection reliability. This is believed to be a flux effect due to the carboxyl group present in the crystalline polyamide.

Furthermore, the binder may include another component as necessary. As the other component, a crystalline resin, an amorphous resin, or the like can be selected as appropriate according to the purpose. The crystalline resin is not particularly limited so long as it is a resin having a crystal region. For example, a polyester resin, a polyolefin resin, and a polyurethane resin can be mentioned. As the polyester resin, for example, a polyethylene terephthalate resin and a polybutylene terephthalate resin can be mentioned. As the polyolefin resin, for example, a polyethylene resin, a polypropylene resin, and a polybutylene resin can be mentioned. Moreover, as the amorphous resin, the same resins as those listed in the description of the crystalline resin can be mentioned. Among these, from a viewpoint of adhesion at a low temperature and in a short time, it is preferable to include a crystalline polyester resin as the other component.

Furthermore, a proportion in the binder of the crystalline polyamide having a carboxyl group is preferably 10 to 100 wt %, more preferably 30 to 100 wt %, and further preferably 50 to 100 wt %. This can cause a flux effect to be exhibited even in low-temperature compression bonding at no greater than 160° C., can improve solder wettability, and can provide excellent connection reliability. Note that in a situation of compression bonding at a low temperature and in a short time in card applications and the like, when the proportion in the binder of the crystalline polyamide having a carboxyl group is no greater than 10 wt %, obtaining a sufficient flux effect is difficult.

Furthermore, the binder may further include a flux compound. As the flux compound, for example, levulinic acid, maleic acid, oxalic acid, malonic acid, succinic acid, glutaric acid, adipic acid, sebacic acid, and other carboxylic acids can be mentioned. A content of the flux compound is preferably 1 to 15 parts by mass relative to 100 parts by mass of the binder, more preferably 1 to 10 parts by mass, and further preferably 1 to 5 parts by mass. This can provide favorable solder connection.

Furthermore, for the binder, a melt volume flow rate (MVR) measured under conditions of a temperature of 160° C. and a load of 2.16 kg is preferably the same as the crystalline polyamide having a carboxyl group. That is, the melt volume flow rate (MVR) is preferably 2 to 50 cm$^3$/10 min., more preferably 3 to 30 cm$^3$/10 min., and further preferably 5 to 10 cm$^3$/10 min. When the melt volume flow rate is too high, hardness at press-out is insufficient, and connection reliability tends to decrease.

[Solder Particles]

The solder particles are not particularly limited so long as a non-eutectic alloy is used. The solder particles are preferably an alloy including no fewer than two types selected from among a group consisting of Sn. Bi, Ag, In, Cu. Sb, Pb. and Zn. The solder particles can be selected as appropriate, according to electrode materials, connection conditions, and the like, from among, for example, the Sn—Pb alloy. Pb—Sn—Sb alloy, Sn—Sb alloy, Sn—Pb—Bi alloy, Bi—Sn alloy. Sn—Bi—Cu alloy, Sn—Cu alloy. Sn—Pb—Cu alloy, Sn—In alloy, Sn—Ag alloy, Sn—Pb—Ag alloy, and Pb—Ag alloy given in JIS Z3282-2017 (corresponding international standard: ISO 9453:2014). Non-eutectic alloy solder particles are in a semi-melted state for a longer time during thermocompression bonding than eutectic alloy solder particles. As such, the resin can be sufficiently removed, and excellent connection reliability can be obtained. Note that in the present specification, "non-eutectic alloy" refers to an alloy having no eutectic point.

A lower limit of a solidus temperature (melting point) of the solder particles is preferably no less than 120° C., more preferably no less than 130° C., and further preferably no less than 135° C. An upper limit of a liquidus temperature of the solder particles may be 210° C. or less and is preferably no greater than 200° C., more preferably no greater than 195° C., and further preferably no greater than 190° C. Here, the liquidus is a curve indicating a relationship between a temperature (melting point) of a liquid phase in equilibrium with a solid phase and a composition of the liquid phase. Moreover, an upper limit of the solidus temperature of the solder particles may be 155° C. or less and is preferably no greater than 150° C. more preferably no greater than 145° C., and further preferably no greater than 140° C. Moreover, the solder particles may have the flux compound directly bonded to its surface for a purpose of activating the surface. Activating the surface can promote metal-bonding with metal wires and electrodes.

Furthermore, the solder particles have a solidus temperature (melting point) of no greater than 155° C.—preferably no greater than 150° C.—and are preferably one or types selected from among a group consisting of an Sn—Bi—Cu alloy, an Sn—Bi—Ag alloy, an Sn—Bi alloy, an Sn—Pb—Bi alloy, and an Sn—In alloy. As specific examples of the solder particles. Sn30Bi0.5Cu, Sn30Bi, Sn40Bi. Sn50Bi. Sn58Bi, Sn40Bi0.1Cu, Sn43Pb14Bi, Sn20In, and the like can be mentioned. This can provide excellent connection reliability.

A lower limit of a mass ratio range of a blending quantity of the solder particles relative to 100 parts by weight of the binder is preferably no less than 20 parts by mass, more preferably no less than 40 parts by mass, and further preferably no less than 80 parts by mass. An upper limit of the mass ratio range of the blending quantity of the solder particles relative to 100 parts by weight of the binder is preferably no greater than 500 parts by mass, more preferably no greater than 400 parts by mass, and further preferably no greater than 300 parts by mass. The blending quantity of the electroconductive particles can also be in terms of volume.

When the blending quantity of the solder particles is too low, excellent conductivity is not obtained. When the blending quantity is too high, a sufficient adhesive force is not obtained, and obtaining excellent conduction reliability becomes difficult. Note that when the solder particles are present in the binder, a volume ratio may be used. When producing the hot-melt adhesive sheet containing electroconductive particles (prior to the solder particles being present in the binder), a mass ratio may be used. The mass ratio can be converted into a volume ratio based on, for example, specific gravities and blending ratios of the blended substances.

Furthermore, the solder particles may be kneaded into and dispersed in the resin of the hot-melt adhesive sheet containing electroconductive particles or may be disposed in a separated state. This disposition may be disposition according to a certain rule. As aspects of regular arrangement, a square lattice, a hexagonal lattice, a rhombic lattice, a rectangular lattice, and other lattice arrangements can be mentioned. Moreover, the solder particles may be disposed as aggregates wherein a plurality of particles is aggregated. In this situation, the disposition of the aggregates in a plan view of the hot-melt adhesive sheet containing electroconductive particles may be regular arrangement or random arrangement as in the disposition of the solder particles described above.

The average particle size of the solder particles is preferably no less than 70% of the thickness of the hot-melt adhesive sheet containing electroconductive particles, more preferably no less than 80%, and further preferably no less than 95%. This enables easily melting the solder particles between the conductive portion of the first electronic component and the conductive portion of the second electronic component during thermocompression bonding and enables metal-bonding.

A lower limit of the average particle size of the solder particles is preferably no less than 10 μm, more preferably no less than 15 μm, and further preferably no less than 20 μm. Moreover, an upper limit of the average particle size of the solder particles is preferably no greater than 50 μm, more preferably no greater than 45 μm, and further preferably no greater than 40 μm. Moreover, a maximum size of the solder particles can be made to be no greater than 200% of the average particle size-preferably no greater than 150% of the average particle size and more preferably no greater than 120% of the average particle size. The maximum size of the solder particles being in the above range causes the solder particles to be interposed (positioned) between the conductive portion of the first electronic component and the conductive portion of the second electronic component, and melting the solder particles can provide metal-bonding between the conductive portions.

Furthermore, the solder particles may be aggregates wherein a plurality of particles is aggregated. When the solder particles are aggregates wherein a plurality of solder particles is aggregated, a size of the aggregates may be made equal to the average particle size of the solder particles described above. Note that the size of the aggregates can be found by observation using an electron microscope or an optical microscope.

Here, the average particle size is an average value of major axis diameters of particles measured at, for example, no less than N=20-preferably no less than N=50 and further preferably no less than N=200-in observation images using a metallurgical microscope, an optical microscope, an electron microscope such as an SEM (scanning electron microscope), or the like. When the particles are spherical, the average particle size is an average value of particle diameters. Moreover, the average particle size may be a measurement value wherein observation images are measured using known image analysis software ("WinROOF": Mitani Corp., "A-zo kun (registered trademark)": Asahi Kasei Engineering Corp., or the like) or a measurement value (N=1000 or more) measured using an image-type particle size distribution measurement device (as an example, FPIA-3000 (Malvern)). An average particle size found from observation images or an image-type particle size distribution measurement device can be made to be an average value of a maximum length of the particles. Note that when producing the hot-melt adhesive sheet containing electroconductive particles, a particle size in which cumulative frequency in a particle size distribution found by laser diffraction or scattering is 50% (D50), an arithmetic mean diameter (preferably volume-based), or other maker value can be used as a simplified means.

[Other Additives]

Various additives in addition to the binder and solder particles described above can be blended into the hot-melt adhesive sheet containing electroconductive particles within a range that does not compromise the effects of the present art. For example, in order to improve gas barrier properties and an elastic modulus, nanosized (primary particle size of no less than 1 nm and less than 1,000 nm) silica may be dispersed. Moreover, in order to control the solder particles to a certain height after compression bonding, resin particles, rubber particles, silicone rubber particles, silica, or the like of a defined size may be dispersed as spacer particles. Moreover, for example, a thermosetting resin or a curing agent may be added within a range that does not compromise the effects of the present art.

The hot-melt adhesive sheet containing electroconductive particles of the present embodiment contains solder particles having a predetermined melting point in a binder that includes a crystalline polyamide having a carboxyl group, the binder having melt viscosities of a predetermined relationship. As such, solder wettability can be improved and excellent adhesion strength and connection reliability can be obtained even when an electrode surface of an electronic component is subjected to an OSP treatment (water-soluble pre-flux treatment). This is believed to be a flux effect due to the carboxyl group present in the crystalline polyamide. Moreover, in the joined body production method of the present embodiment, a conductive portion of a first electronic component and a conductive portion of a second electronic component are metal-bonded by melted solder particles. As such, swelling and stretching due to moisture absorption by the binder in a wet heat test can be suppressed, and excellent connection reliability can be obtained.

[Method of Producing Hot-Melt Adhesive Sheet Containing Electroconductive Particles]

A method of producing the hot-melt adhesive sheet containing electroconductive particles includes a varnish preparation step of dissolving each resin component of the binder in a solvent to prepare a varnish, a step of preparing a resin composition containing electroconductive particles whereby the solder particles are added to obtain a resin composition containing electroconductive particles, and a drying step of drying the resin composition containing electroconductive particles after applying on to a peelable substrate at a predetermined thickness. Note that when disposing the electroconductive particles in the hot-melt adhesive sheet containing electroconductive particles in a separated manner or in a regular arrangement, it is favorable to provide the sheet without adding the electroconductive particles and separately dispose the electroconductive particles by a known method.

The solvent used for each resin component is not particularly limited and can be selected as appropriate according to the purpose. For example, a mixed solvent of methyl ethyl ketone:toluene:cyclohexanone at 50:40:10 (mass ratios) or a mixed solvent of toluene:ethyl acetate at 50:50 (mass ratios) can be used.

Furthermore, as the peelable substrate, for example, one whose contact angle to water is no less than 80° can be mentioned. As specific examples of the detachable substrate, for example, a silicone film; a fluorine film: a silicone film; and PET. PEN, or glassine subjected to a release treatment with a fluorine or other release agent can be mentioned. Moreover, a thickness of the peelable substrate is not particularly limited and can be selected as appropriate according to the purpose. However, 20 μm to 120 μm is preferable.

Furthermore, the hot-melt adhesive sheet containing electroconductive particles may be molded in the form of a tape and supplied as a wound film body wound around a winding core. A diameter of the winding core is not particularly limited and can be selected as appropriate according to the purpose. However, 50 to 1,000 mm is preferable. A film length is also not particularly limited. At or over 5 m enables prototyping using a production apparatus, and at or less than 1,000 m prevents an excessive load in workability and handling.

EXAMPLES

4. Examples

In the present examples, a hot-melt adhesive sheet containing electroconductive particles which contain solder particles was produced, and this was used to create a joined body. The joined body was then evaluated for its connection reliability, insulation resistance, initial adhesion strength, and conduction resistance following a water immersion test. Note that the examples are not limited to the present examples.

[Production of Solder Particles]

Metal materials were placed at predetermined blending ratios in a container being heated. After melting, these were cooled, and a solder alloy was obtained. From the solder alloy, a powder was produced by atomization. This was classified so that a particle size was in a range of 20 to 38 μm, and solder powders of the following compositions were obtained.

Sn-40Bi-0.1Cu (solid-phase melting point 139° C.)
Sn-58Bi (solid-phase melting point 138° C.)
Sn-57Bi-0.4Ag (solid-phase melting point 136° C.)
Sn-50In (solid-phase melting point 120° C.)
Sn-3Ag-0.5Cu (solid-phase melting point 217° C.)

[Production of Hot-Melt Adhesive Sheet Containing Electroconductive Particles]

The following resins were prepared.

M1276 (made by Arkema S. A.; crystalline polyamide; terminal carboxyl group concentration 6.56 mg KOH/g; melting point 109° C.; MVR 8 cm$^3$/10 min.; weight-average molecular weight 12,000)→made into a solution at solid content/ethanol/toluene=30/35/35

PES111EE (made by Toagosei; crystalline polyester)—made into a solution at solid content/cyclohexanone=25/75.

As illustrated in Table 1 and Table 2, the above resins were mixed and stirred at predetermined blending quantities in terms of solid content (parts by mass) to obtain a mixed varnish. Next, predetermined parts by mass of the solder particles, relative to 100 parts by mass of the solid content of the mixed varnish, were added to the obtained mixed varnish, and a resin composition containing electroconductive particles was obtained. The obtained resin composition containing electroconductive particles was coated on a PET film of a 50 μm thickness so that an average thickness after drying was 40 μm. This was dried for 5 minutes at 70° C. and then for 5 minutes at 120° C. to produce the hot-melt adhesive sheet containing electroconductive particles.

[Production of Joined Body]

As the first electronic component, a printed wiring board [0.4 mm pitch (line/space=0.2/0.2 mm), glass epoxy substrate thickness 1.0 mm, copper pattern thickness 35 μm, surface OSP treated] was used.

As the second electronic component, a flexible printed board [0.4 mm pitch (line/space=0.2/0.2 mm), polyimide substrate thickness 50 μm, copper pattern thickness 12 μm, nickel/gold-plated] was used.

The hot-melt adhesive sheet containing electroconductive particles was cut to a width of 2.0 mm and subjected to temporary compression bonding onto the conductive portion of the first electronic component under conditions of 120° C., 1 MPa. and 1 sec. Next, the second electronic component was disposed on the hot-melt adhesive sheet containing electroconductive particles. Next, the second electronic component was heated and pressed via a buffer material (silicone rubber, thickness 0.2 mm), by a heating tool (width 2.0 mm), and under conditions of 140° C., 3 MPa, and 5 sec. to obtain the joined body.

[Measurement of Melt Viscosity]

A sensor of an 8 mm diameter and a plate were mounted in a rheometer MARS3 (made by HAAKE), and the hot-melt adhesive sheet containing electroconductive particles was set. Melt viscosities were then measured under conditions of a gap of 0.2 mm, a heating rate of 5° C./min., a frequency of 1 Hz, and a measurement temperature range of 60 to 200° C. A viscosity at 100° C. (V1) and a viscosity at 120° C. (V2) were read, and a ratio thereof (V1/V2) was calculated. Note that the viscosities at 100° C. (V1) in the examples and the comparative examples were 20,000 to 300,000 Pa·s and that the viscosities at 120° C. (V2) of the examples and the comparative examples were 1,000 to 8,000 Pa·s.

[Evaluation of Connection Reliability]

After a high-temperature and high-humidity test of the joined body (leaving this for 500 hours in a 60° C. 95% RH environment) and after a heat cycle test (leaving this for 500 cycles of 30 minutes at −40° C. and 30 minutes at 100° C.), a digital multimeter was used to measure a resistance value of when a 1 mA current was flowed by a four-terminal method. The resistance value was measured for thirty channels, and the largest resistance value was evaluated according to the following evaluation criteria.

AA: resistance value less than 0.1 Ω
A: resistance value no less than 0.1Ω, less than 0.2 Ω
B: resistance value no less than 0.2Ω, less than 0.5 Ω
C: resistance value no less than 0.5 Ω

[Evaluation of Insulation Resistance Value]

An initial insulation resistance value of the joined body was measured and evaluated by the following method. A digital multimeter was used to measure an insulation resistance value of when a 20V voltage was applied between adjacent conductive portions. The resistance value was measured for fifteen channels, and the largest resistance value was evaluated according to the following evaluation criteria.

A: resistance value no less than $10^9 \Omega$
B: resistance value no less than $10^8 \Omega$, less than $10^9 \Omega$
C: resistance value less than $10^8 \Omega$

[Evaluation of Adhesion Strength]

A 90° peeling test (JIS K6854-1) of peeling the flexible printed board from the printed wiring board in a 90° direction was performed. In the peeling test, adhesion strength was measured for a test piece cut to a 1 cm width, and adhesion strength was evaluated according to the following criteria.

A: adhesion strength no less than 12 N/cm
B: adhesion strength no less than 7 N/cm, less than 12 N/cm
C: adhesion strength less than 7 N/cm

[Evaluation of Conduction Resistance Following Water Immersion Test]

After measuring the initial resistance value of the joined body, this joined body was immersed in mom-temperature water and taken out after 24 hours, whereupon its conduction resistance value was measured. This was evaluated according to the following evaluation criteria.

A: ratio of resistance value following immersion/initial resistance value less than 2
C: ratio of resistance value following immersion/initial resistance value no less than 2

Table 1 gives the formulation of the hot-melt adhesive sheet containing electroconductive particles, the evaluation of connection reliability of the joined body, the evaluation of insulation resistance, the evaluation of adhesion strength, and the evaluation of conduction resistance following the water immersion test for Examples 1 to 5. Moreover, Table 2 gives the formulation of the hot-melt adhesive sheet containing electroconductive particles, the evaluation of connection reliability of the joined body, the evaluation of insulation resistance, the evaluation of adhesion strength, and the evaluation of conduction resistance following the water immersion test for Examples 6 to 8 and Comparative Examples 1 to 3. In terms of practicality, it is preferable for all parameters to be no lower than B.

TABLE 1

|  |  | Example 1 | Example 2 | Example 3 | Example 4 | Example 5 |
|---|---|---|---|---|---|---|
| Crystalline polyamide | M1276 | 70 | 70 | 70 | 70 | 70 |
| Crystalline polyester | PES-111EE | 30 | 30 | 30 | 30 | 30 |
| Electroconductive particles | Sn-40Bi-0.1Cu (139° C.) | 45 | 135 | 225 | 315 | 450 |
| Melt-viscosity ratio | V1/V2 | 13.2 | 11.2 | 15.5 | 16.4 | 18.4 |
| Connection reliability | 60° C., 95% RH-500 h | A | A | A | A | A |
|  | TCT-500 cyc | AA | AA | AA | AA | AA |
| Insulation resistance | Initial | A | A | A | A | B |
| Adhesion strength [N/cm] | Initial | 13.9 | 12.9 | 13.5 | 11.8 | 10 |
|  |  | A | A | A | B | B |
| Water immersion test | After 24 h | A | A | A | A | A |

TABLE 2

|  |  | Example 6 | Example 7 | Example 8 | Comparative Example 1 | Comparative Example 2 | Comparative Example 3 |
|---|---|---|---|---|---|---|---|
| Crystalline polyamide | M1276 | 100 | 70 | 70 | 70 | 70 | — |
| Crystalline polyester | PES-111EE | — | 30 | 30 | 30 | 30 | 100 |
| Electroconductive particles (Melting point: ° C.) | Sn-40Bi-0.1Cu (139° C.) | 45 | — | 45 | — | — | 45 |
|  | Sn-57Bi-0.4Ag (136° C.) | — | 45 | — | — | — | — |
|  | Sn-50In (120° C.) | — | — | — | 45 | — | — |
|  | Sn-3Cu-0.5Cu (217° C.) | — | — | — | — | 45 | — |
| Organic acid | Glutaric acid | — | — | 1 | — | — | — |
| Melt-viscosity ratio | V1/V2 | 33.2 | 14.7 | 10.2 | 14.5 | 14.0 | 25.1 |
| Connection reliability | 60° C., 95% RH-500 h | A | A | AA | C | C | C |
|  | TCT-500 cyc | A | A | AA | A | A | B |
| Insulation resistance | Initial | A | A | A | A | A | A |
| Adhesion strength [N/cm] | Initial | 12.5 | 13.1 | 14.5 | 13.2 | 13.1 | 8.9 |
|  |  | A | A | A | A | A | B |
| Water immersion test | After 24 h | A | A | A | C | C | C |

In Comparative Example 1, the melting point of the solder particles is 120° C. and too low. As such, no favorable connection was obtained, and the evaluations of the conduction resistance value following the high-temperature and high-humidity test and the water immersion test were C. In Comparative Example 2, the melting point of the solder particles is 217° C. and too high. As such, no favorable connection was obtained, and the evaluations of the conduction resistance value following the high-temperature and high-humidity test and the water immersion test were C. Comparative Example 3 includes no crystalline polyamide resin. As such, no favorable connection was obtained, and the evaluations of the conduction resistance value following the high-temperature and high-humidity test and the water immersion test were C.

Meanwhile, in Examples 1 to 7, favorable results were obtained for each evaluation. Moreover, favorable results were also obtained for each evaluation in Example 8, which added glutaric acid. In particular, an improvement was seen over not adding glutaric acid in the evaluation of the conduction resistance value of the conduction resistance value following the high-temperature and high-humidity test. This is believed to be a flux effect of glutaric acid forming metal bonding between electrodes of the OSP-treated board and the solder particles.

REFERENCE SIGNS LIST

10 first electronic component, 11 first conductive portion, 20 second electronic component, 21 second conductive portion, 30 adhesive layer, 31 solder particles, 32 solder joint, 40 card member, 41 opening, 42 antenna pattern, 42a first exposed portion. 42b second exposed portion, 50 IC chip, 51 contact terminal

The invention claimed is:

1. A joined body production method comprising:
    subjecting a first electronic component comprising a first conductive portion and a second electronic component comprising a second conductive portion to thermocompression bonding via a hot-melt adhesive sheet, to connect the first conductive portion and the second conductive portion, the hot-melt adhesive sheet comprising a binder and solder particles, the binder comprising a crystalline polyamide resin having a carboxyl group,
    wherein:
    a melting point of the solder particles is 30° C. to 0° C. lower than a temperature of the thermocompression bonding; and
    when melt viscosities of the hot-melt adhesive sheet are measured under a condition of a heating rate of 5° C./min., the hot-melt adhesive sheet has a ratio of a melt viscosity at 40° C. lower than the temperature of the thermocompression bonding to a melt viscosity at 20° C. lower than the temperature of the thermocompression bonding of no less than 10 and no more than 25.

2. The joined body production method according to claim 1, wherein when the melt viscosities of the hot-melt adhesive sheet measured under the condition of the heating rate of 5° C./min., the hot-melt adhesive sheet has a ratio of a melt viscosity at 100° C. to a melt viscosity at 120° C. of no less than 10.

3. The joined body production method according to claim 1, wherein the binder further comprises a crystalline polyester resin.

4. The joined body production method according to claim 1, wherein a proportion of the crystalline polyamide resin in the binder is 50 to 100 wt % relative to a total weight of the binder.

5. The joined body production method according to claim 1, wherein the hot-melt adhesive sheet further comprises a flux compound.

6. The joined body production method according to claim 5, wherein the flux compound is a carboxylic acid, and
    a content of the carboxylic acid is 1 to 10 parts by mass relative to 100 parts by mass of the binder.

7. The joined body production method according to claim 1, wherein the solder particles are composed of at least one selected from the group consisting of an Sn—Bi—Cu alloy, an Sn—Bi—Ag alloy, an Sn—Bi alloy, an Sn—Pb—Bi alloy, and an Sn—In alloy.

8. The joined body production method according to claim 1, wherein a content of the solder particles in the hot-melt adhesive sheet is 40 to 320 parts by weight relative to 100 parts by weight of the binder.

9. The joined body production method according to claim 1, wherein an average particle size of the solder particles is no less than 70% of a thickness of the hot-melt adhesive sheet.

10. The joined body production method according to claim 1, wherein at least one of the first conductive portion and the second conductive portion is subjected to a water-soluble pre-flux treatment.

11. The joined body production method according to claim 1, wherein the temperature of the thermocompression bonding is 120° C. to 180° C.

12. The joined body production method according to claim 1, wherein when the melt viscosities of the hot-melt adhesive sheet measured under the condition of the heating rate of 5° C./min., the hot-melt adhesive sheet has the ratio of the melt viscosity at 40° C. to the melt viscosity at 20° C. of no less than 10 and no more than 18.4.

* * * * *